United States Patent
Du (10) Patent No.: US 10,608,056 B2
(45) Date of Patent: Mar. 31, 2020

(54) DISPLAY UNIT AND METHOD OF PRODUCING THE SAME, DISPLAY PANEL

(71) Applicant: BOE TECHNOLOGY GROUP CO., LTD., Beijing (CN)

(72) Inventor: Xiaobo Du, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/967,562

(22) Filed: Apr. 30, 2018

(65) Prior Publication Data
US 2019/0043935 A1 Feb. 7, 2019

(30) Foreign Application Priority Data
Aug. 7, 2017 (CN) .......................... 2017 1 0667310

(51) Int. Cl.
*H01L 27/32* (2006.01)
*H01L 51/56* (2006.01)

(52) U.S. Cl.
CPC ...... *H01L 27/3225* (2013.01); *H01L 27/3258* (2013.01); *H01L 51/56* (2013.01); *H01L 2227/323* (2013.01)

(58) Field of Classification Search
CPC . H01L 27/3258; H01L 51/56; H01L 27/3225; H01L 2227/323; H01L 51/5265
See application file for complete search history.

(56) References Cited

U.S. PATENT DOCUMENTS

| 2012/0043536 | A1 | 2/2012 | Inoue | |
| 2016/0093641 | A1* | 3/2016 | Takahashi | .......... H01L 27/1225 257/43 |
| 2018/0183005 | A1 | 6/2018 | Peng et al. | |
| 2018/0226462 | A1 | 8/2018 | Zhou et al. | |

FOREIGN PATENT DOCUMENTS

| CN | 1967865 A | 5/2007 |
| CN | 102422715 A | 4/2012 |
| CN | 106206992 A | 12/2016 |
| CN | 106783921 A | 5/2017 |
| JP | 2004296224 A | 10/2004 |

OTHER PUBLICATIONS

Jan Kalinowski et al., Magnetic Field Effects On Emission and Current in Alq2-Based Electroluminescent Diodes, Chemical Physics Letters 380, Oct. 9, 2005, 6 pages.
B.F. Ding et al., Magnetic Field Effects On the Electroluminescence of Organic Light Emitting Devices: A Tool to Indicate the Carrier Mobility, Applied Physics Letters 97, Oct. 21, 2010, 4 pages.
Kai Xu et al., Magnetic Field Effects On Electroluminescence in Phosphorescence Organic Light Emitting Diodes, Organic Electronics 15, Dec. 27, 2013, 5 pages.
First Chinese Office Action dated May 29, 2019, received for corresponding Chinese Application No. 201710667310.2.
Second Chinese Office Action dated Sep. 27, 2019 for corresponding Chinese Application No. 201710667310.2.

* cited by examiner

*Primary Examiner* — Jasmine J Clark
(74) *Attorney, Agent, or Firm* — Kinney & Lange, P.A.

(57) ABSTRACT

The present disclosure relates to a display unit and a method of producing the same, and a display panel. In an embodiment, the display unit comprises: a substrate; an electroluminescent unit on the substrate; and at least one magnetic layer on the substrate, wherein the electroluminescent unit is in a magnetic field of the magnetic layer.

15 Claims, 5 Drawing Sheets

DISPLAY UNIT AND METHOD OF PRODUCING THE SAME, DISPLAY PANEL

CROSS-REFERENCE TO RELATED APPLICATION(S)

This application claims priority to Chinese Patent Application No. 201710667310.2 filed on Aug. 7, 2017 in the State Intellectual Property Office of China, the disclosure of which is hereby incorporated by reference in its entirety.

BACKGROUND

Technical Field

The present disclosure relates to a display unit and a method of producing the same, and a display panel.

Description of the Related Art

An electroluminescent unit, such as an Organic Light Emitting Diode (OLED), a Quantum Dot Light Emitting Diode (QLED), and the like, has an all-solid-state structure, high luminance, a full viewing angle, a fast response speed, a wide operating temperature range and other advantages, and has been widely used in an electronic display product.

SUMMARY

According to an aspect of the present disclosure, there is provided a display unit, and the display unit comprises: a substrate; an electroluminescent unit on the substrate; and at least one magnetic layer on the substrate, the electroluminescent unit is in a magnetic field of the magnetic layer.

In some embodiments, the electroluminescent unit comprises an electroluminescent layer, and an orthographic projection of the magnetic layer on the substrate is at least partially overlapped with an orthographic projection of the electroluminescent layer on the substrate.

In some embodiments, the magnetic layer is between the substrate and the electroluminescent unit.

In some embodiments, the display unit further comprises: at least one of a passivation layer, a planarization layer, a buffer layer, a gate insulating layer and an interlayer dielectric layer between the substrate and the electroluminescent unit, the magnetic layer is between the electroluminescent unit and the at least one of the passivation layer, the planarization layer, the buffer layer, the gate insulating layer and the interlayer dielectric layer.

In some embodiments, the display unit further comprises: at least one of a passivation layer, a planarization layer, a buffer layer, a gate insulating layer and an interlayer dielectric layer between the substrate and the electroluminescent unit, at least a portion of the at least one of the passivation layer, the planarization layer, the buffer layer, the gate insulating layer and the interlayer dielectric layer is configured as the magnetic layer.

In some embodiments, the display unit further comprises: a switch element disposed on the substrate and connected to the electroluminescent unit, an orthographic projection of the magnetic layer on the substrate is not overlapped with an orthographic projection of the switch element on the substrate.

In some embodiments, the magnetic layer is made of a permanent magnetic material.

In some embodiments, the permanent magnetic material comprises one of a ferrite magnetic material, a metal alloy magnetic material, or a rare earth magnetic material or any combination thereof.

In some embodiments, the electroluminescent unit comprises an organic light emitting diode device.

According to another aspect of the present disclosure, there is provided a display panel, the display panel comprises a plurality of display units of any one of the above-mentioned embodiments arranged in an array.

In some embodiments, magnetic layers of at least some of the plurality of display units is disposed in a same layer and connected to each other.

According to yet another aspect of the present disclosure, there is provided a method of producing a display unit, the method comprises steps of: providing a substrate; and forming an electroluminescent unit and at least one magnetic layer on the substrate, the electroluminescent unit is in a magnetic field of the magnetic layer.

In some embodiments, the step of forming the electroluminescent unit on the substrate comprises: forming an electroluminescent layer, an orthographic projection of the magnetic layer on the substrate is at least partially overlapped with an orthographic projection of the electroluminescent layer on the substrate.

In some embodiments, the step of forming the magnetic layer is before the step of forming the electroluminescent unit, so that the magnetic layer is between the electroluminescent unit and the substrate.

In some embodiments, before the step of forming the electroluminescent unit on the substrate, the method further comprises: forming at least one of a passivation layer, a planarization layer, a buffer layer, a gate insulating layer and an interlayer dielectric layer, the magnetic layer is between the electroluminescent unit and the at least one of the passivation layer, the planarization layer, the buffer layer, the gate insulating layer and the interlayer dielectric layer.

In some embodiments, before the step of forming the electroluminescent unit on the substrate, the step of forming the magnetic layer on the substrate comprises: forming at least one of a passivation layer, a planarization layer, a buffer layer, a gate insulating layer and an interlayer dielectric layer; and magnetizing at least a portion of the at least one of the passivation layer, the planarization layer, the buffer layer, the gate insulating layer and the dielectric interlayer layer.

In some embodiments, the method further comprises: forming a switch element on the substrate, the switch element being connected to the electroluminescent unit, an orthographic projection of the magnetic layer on the substrate is not overlapped with an orthographic projection of the switch element on the substrate.

BRIEF DESCRIPTION OF THE DRAWINGS

In order to provide a more clear explanation of technical solutions according to embodiments of the present disclosure, there is provided a brief introduction of the attached drawings used in the embodiments hereinafter. Obviously, the attached drawings mentioned in the following description are merely used to illustrate some embodiments of the present disclosure, but not to limit the present disclosure.

DETAILED DESCRIPTION OF THE EMBODIMENTS

In order to provide a more clear understanding of objects, technique solutions and advantages of embodiments of the present disclosure, technical solutions of embodiments of the present disclosure will be described clearly and completely hereinafter in conjunction with the attached drawings mentioned in embodiments of the present disclosure. Obviously, the embodiments illustrated in these drawings are only some of embodiments of the present disclosure, instead of all of the embodiments of the present disclosure. For those skilled in the art, all other embodiments achieved by referring to the following embodiments of the present disclosure without any creative work fall into the scope of the present disclosure.

Unless otherwise specified definitions, technical terminologies or scientific terminologies adopted in the present disclosure should indicate common meanings in the art, as being understood by those skilled in the art. Terminologies, such as "first", "second" and the likes adopted in the present disclosure are only for distinguishing one component from another component, instead of expressing or implying that there is any sequence, quantity or importance among them. Moreover, terminologies, such as "one", "a/an" or "the" and the likes only indicate existence of at least one, instead of limiting the quantity. Terminologies "comprise", "include" and any other variations are adopted to indicate a non-exclusive inclusion, that is, an element or an article which presents before such terminology contains element(s) or article(s) and their equivalents listed after this terminology. Terminologies "connect to" or "connect with" and the likes should be explained and illustrated in a broad sense, for example, it can be a mechanical or physical connection, or it can be an electrical connection; or else, it can be a direction connection or an indirect connection with an intermediate agency. Terminologies "upper", "lower", "left", "right" and the like merely indicate relatively positional relationships, which may be changed correspondingly depending on change of an absolute position of an object to be described.

In the electroluminescent unit, usually only singlet excitons radiate and emit light, however a proportion of singlet excitons is small. For example, the ratio of singlet excitons to triplet excitons is about 1:3, thus luminous efficiency of the electroluminescent unit is limited. The Applicant finds that a magnetic field may influence a spin state of carriers (holes or electrons) so that the proportion of singlet excitons is increased, thereby increasing the luminous efficiency of the electroluminescent unit.

A display unit, a method of producing the display unit, and a display panel are provided in at least one embodiment of the present disclosure. The display unit includes a substrate, an electroluminescent unit, and at least one magnetic layer. The electroluminescent unit and the magnetic layer are disposed on the substrate, and the electroluminescent unit is disposed in a magnetic field of the magnetic layer. The magnetic layer is provided in the display unit so as to increase the proportion of singlet excitons in the electroluminescent unit, thereby improving the luminous efficiency of the electroluminescent unit and increasing brightness of a display image of the display unit. The electroluminescent unit includes, for example, an organic light emitting diode, a quantum dot light emitting diode, and the like.

For example, in at least one embodiment of the present disclosure, the magnetic layer may be configured to replace a layer in the display unit, so that the display unit may be much lighter or thinner.

For example, in at least one embodiment of the present disclosure, the magnetic layer may be patterned so that the magnetic layer avoids a circuit dense region in the display unit, thereby reducing an influence of the magnetic field on a circuit in the display unit and improving the display effect of the display unit.

Hereinafter, a display unit, and a method of producing the display unit, and a display panel according to embodiments of the present disclosure will be described in detail with reference to the accompanying drawings. In the following description, an electroluminescent unit is described by taking an organic light emitting diode as an example.

Figure 1:
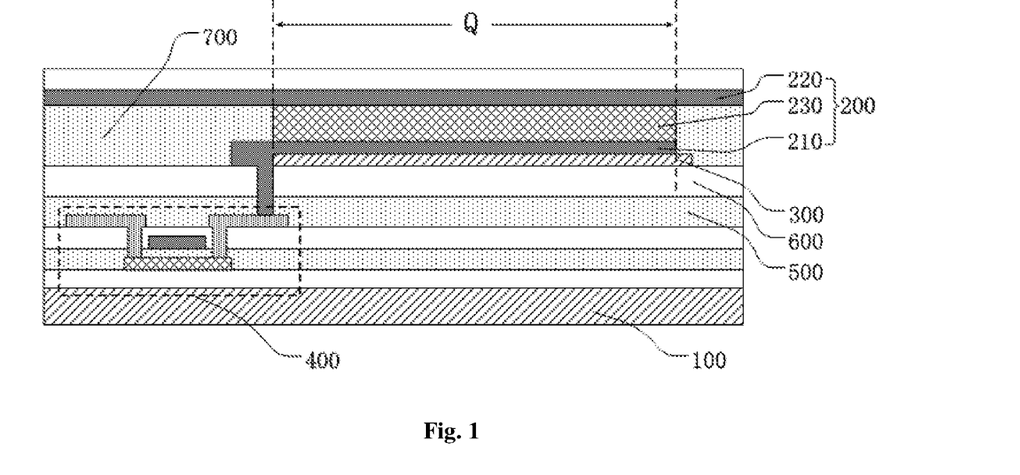
FIG. 1 shows a schematic view, in cross-section, of a display unit according to an embodiment of the present disclosure.

A display unit is provided in an embodiment of the present disclosure. FIG. 1 shows a schematic view, in cross-section, of a display unit according to an embodiment of the present disclosure. For example, as shown in FIG. 1, the display unit comprises: a substrate 100 and an organic light emitting diode 200 and at least one magnetic layer 300. The organic light emitting diode 200 is disposed on the substrate 100, and the magnetic layer 300 is disposed between the organic light emitting diode 200 and the substrate 100. The magnetic layer 300 between the substrate 100 and the organic light emitting diode 200 may generate a magnetic field, and the luminous efficiency of the organic light emitting diode 200 located in the magnetic field may be increased, thereby increasing brightness of a display image of the display unit, and reducing power consumption of the display unit.

A magnetic field distribution and a magnetic field intensity of the magnetic layer 300 are related to a shape of the magnetic layer 300 and a distance from the magnetic layer 300. In order to place the organic light emitting diode 200 at a relatively large magnetic field intensity, a relative position of the magnetic layer 300 and the organic light emitting diode 200 may be defined. For example, in at least one embodiment of the present disclosure, an orthographic projection of the magnetic layer 300 on the substrate 100 is at least partially overlapped with an orthographic projection of the organic light emitting diode 200 on the substrate, for example, an overlapping region Q as shown in FIG. 1. In this way, the organic light emitting diode 200 can be located in a strong magnetic field.

In the embodiment of the present disclosure, the size and the specific position of the overlapping region Q are not limited as long as the magnetic field generated by the magnetic layer 300 can increase the luminous efficiency of the organic light emitting diode 200. For example, in at least one embodiment of the present disclosure, as shown in FIG. 1, the organic light emitting diode 200 includes an organic light emitting layer 230. The orthographic projection of the magnetic layer 300 on the substrate 100 and an orthographic projection of the electroluminescent layer 230 on the substrate 100 are at least partially overlapped with each other, they have the overlapping region Q. In this way, the organic light emitting layer 230 may be located in a magnetic field with sufficient intensity (generated by the magnetic layer 300) so as to further increase the luminous efficiency of the organic light emitting layer 230 of the organic light emitting diode 200. For example, the orthographic projection of the organic light emitting layer 230 on the substrate 100 is located within the orthogonal projection of the magnetic layer 300 on the substrate 100; at this time, an area of the orthographic projection of the organic light emitting layer 230 on the substrate 100 is equal to or smaller than an area of the orthogonal projection of the magnetic layer 300 on the substrate 100.

In an embodiment of the present disclosure, as shown in FIG. 1, the organic light emitting diode 200 may further include a first electrode 210 and a second electrode 220 disposed opposite to each other. The first electrode 210 is located between the second electrode 220 and the substrate 100, and the organic light emitting layer 230 is located between the first electrode 210 and the second electrode 220. For example, the first electrode 210 is an anode and the second electrode 220 is a cathode. Alternatively, the first electrode 210 is a cathode and the second electrode 220 is an anode. In an embodiment, the magnetic layer 300 is disposed between the substrate 100 and the first electrode 210, and the magnetic layer 300 is disposed next to the first electrode 210 (for example, the magnetic layer 300 and the first electrode 210 are in contact with each other). As a result, an distance between the magnetic layer 300 and the organic light emitting layer 230 of the organic light emitting diode 200 may be reduced, and the effect of the magnetic field of the magnetic layer 300 on the organic light emitting layer 230 may be improved.

A material for producing the first electrode 210 and the second electrode 220 of the organic light emitting diode 200 is not limited in the embodiment of the present disclosure. For example, the material for producing the first electrode 210 and the second electrode 220 may be a transparent conductive material, such as indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), carbon nanotubes and the like, or a metal material, such as silver, aluminum, calcium, indium, lithium, magnesium and the like, and an alloy thereof (e.g., a magnesium-silver alloy).

In an embodiment, the organic light emitting diode 200 may further include a hole injection layer, a hole transport layer, an electron injection layer, and an electron transport layer. It is not limited in the embodiment of the present disclosure.

The embodiment of the present disclosure does not limit the magnetic field intensity of the magnetic layer 300. The magnetic field intensity of the magnetic layer 300 can be set according to actual needs. For example, in at least one embodiment of the present disclosure, the magnetic layer 300 is configured such that the magnetic field intensity, at a position where the organic light emitting layer 230 is located, is approximately 1 to 1000 milli-Tesla.

In an embodiment, the magnetic layer 300 is made of a permanent magnetic material so that the organic light emitting layer 230 of the organic light emitting diode 200 can be in a magnetic field with a stable magnetic field intensity, thereby maintaining the stability of the display image of the display unit.

For example, a material for producing the magnetic layer 300 may include one or a combination of a ferrite magnetic material, a metal alloy magnetic material, and a rare earth magnetic material, and the like, such as a platinum-iron alloy magnetic material, a platinum-cobalt alloy magnetic material, a hexagonal ferrite magnetic material (for example, ferrite materials including tantalum, niobium, etc.), strontium cobalt ferrite and NdFeB (neodymium iron boron).

In an embodiment, a material for producing the magnetic layer 300 may be conductive or insulating, and it is not limited in the embodiment of the present disclosure. When the magnetic layer 300 is made of a conductive material, it is required that an arrangement of the magnetic layer 300 does not affect electrical properties of the electronic elements or circuits in the display unit, for example, the magnetic layer 300 is configured to be insulated from the electronic elements or circuits in the display unit.

It should be noted the embodiments of the present disclosure do not limit a type of the display unit. For example, in at least one embodiment of the present disclosure, the display unit may be an active matrix organic light emitting diode (AMOLED) display unit, or a passive matrix organic light emitting diode (PMOLED) display unit, or the like.

In at least one embodiment of the present disclosure, as shown in FIG. 1, the display unit may further include a switch element, such as a thin film transistor 400 (surrounded by a dotted line in FIG. 1), disposed on the substrate 100. The thin film transistor 400 is electrically connected to the first electrode 210 of the organic light emitting diode 200 so as to control a light emitting state of the organic light emitting diode 200, such as turning on or turning off.

In the embodiment of the present disclosure, no limitation is imposed on the type and the number of the thin film transistor 400 provided in the display unit. In some embodiments, one or more thin film transistors 400 may be disposed in the display unit. In some embodiments, the thin film transistor 400 may be a top-gate type thin film transistor, or a bottom-gate type thin film transistor, or a dual gate thin film transistor. In the embodiment of the present disclosure, the thin film transistor 400 in the display unit will be described by taking a top-gate type thin film transistor as an example.

Figure 2:
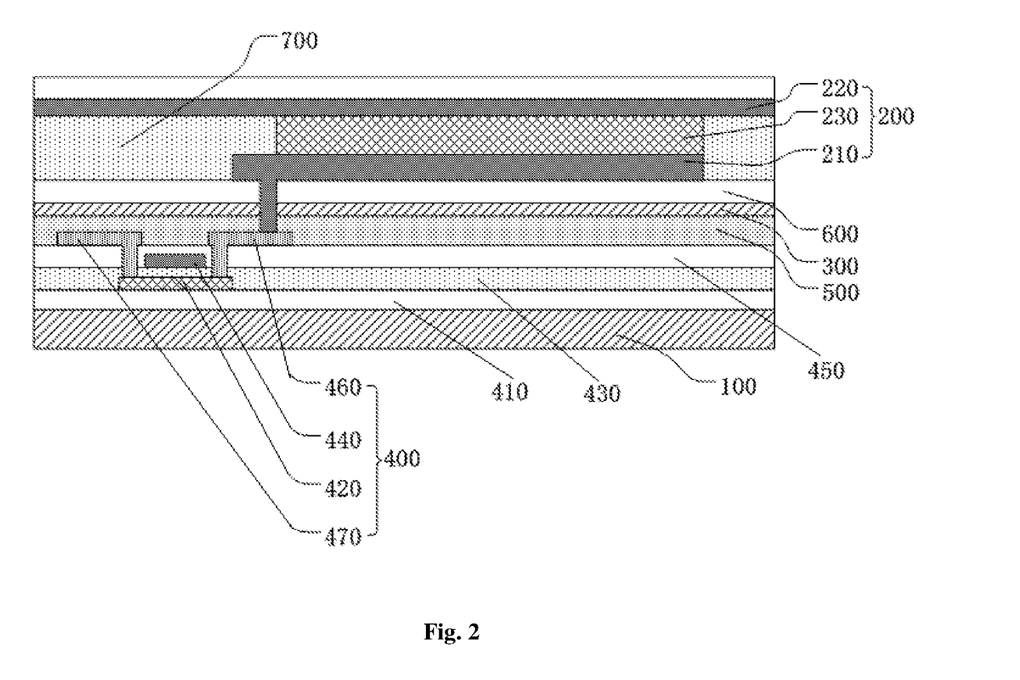
FIG. 2 shows a schematic view, in cross-section, of another display unit according to an embodiment of the present disclosure.

FIG. 2 shows a schematic view, in cross-section, of another display unit according to an embodiment of the present disclosure. As shown in FIG. 2, the display unit further includes a buffer layer 410, an active layer 420, a gate insulating layer 430, a gate layer including a gate electrode 440, an interlayer dielectric layer 450, a source/drain layer including a drain electrode 460 and a source electrode 470, a passivation layer 500, and a planarization layer 600 sequentially disposed on the substrate 100. The above layers are located between the substrate 100 and the organic light emitting diode 200. The gate electrode 440, the source electrode 470, the drain electrode 460, and the active layer 420 constitute a top-gate type thin film transistor 400. The source electrode 470 and the drain electrode 460 are respectively electrically connected to the active layer 420 through via holes penetrating the gate insulating layer 430 and the interlayer dielectric layer 450. The drain electrode 470 is electrically connected to the first electrode 210 of the organic light emitting diode 200 through another via hole so that the turning on and off of the organic light emitting diode 200 and the luminous intensity thereof may be controlled by the thin film transistor 400.

In some embodiments, the buffer layer 410, the interlayer dielectric layer 450, the passivation layer 500, and the planarization layer 600 are not necessarily provided, and one or more of them may be omitted according to actual needs.

In the embodiment of the present disclosure, specific arrangements of the magnetic layer 300 are not limited. The magnetic layer 300 may be separately provided in the display unit, or configured to replace a structural layer in the display unit. In the following, several arrangements of the magnetic layer 300 will be described.

In an embodiment of the present disclosure, the magnetic layer 300 may be disposed at any position between the organic light emitting diode 200 and the substrate 100. For example, the magnetic layer 300 may be located between any two adjacent layers of the organic light emitting diode 200, the planarization layer 600, the passivation layer 500, the interlayer dielectric layer 450, the gate insulating layer 430, and the buffer layer 410. For example, as shown in FIG. 1, the magnetic layer 300 is located between the organic light emitting diode 200 and the planarization layer 600. As shown in FIG. 2, the magnetic layer 300 may be disposed between the planarization layer 600 and the passivation layer 500. In an alternative embodiment, the magnetic layer 300 may be located between the passivation layer 500 and the interlayer dielectric layer 450. In an alternative embodiment, the magnetic layer 300 may be located between the interlayer dielectric layer 450 and the gate insulating layer 430. In an alternative embodiment, the magnetic layer 300 may be located between the gate insulating layer 430 and the buffer layer 410. In an embodiment, the display unit may include two or more magnetic layers 300 and the two or more magnetic layers 300 may be disposed at the above-mentioned multiple positions.

Figure 3:
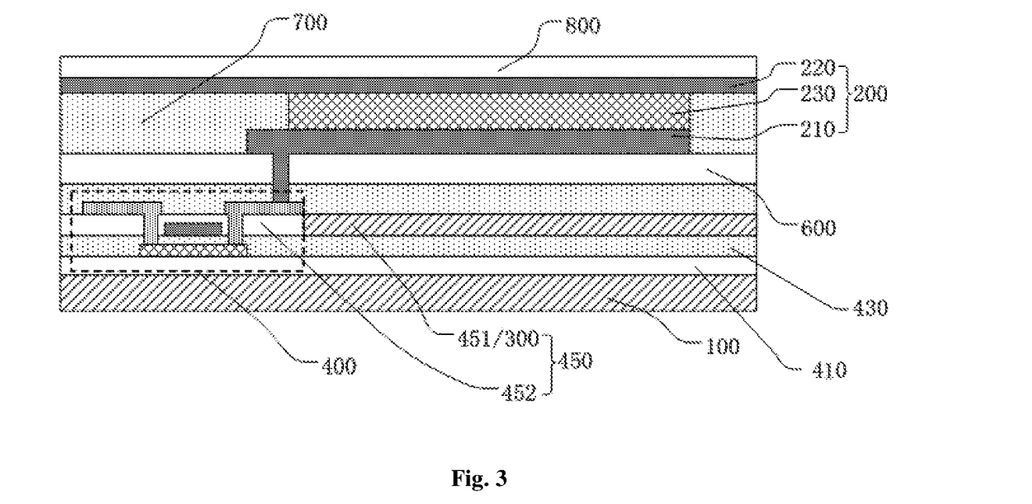
FIG. 3 shows a schematic view, in cross-section, of another display unit according to an embodiment of the present disclosure.

In an embodiment of the present disclosure, the magnetic layer 300 may be configured as an insulating layer, and as a part of the structural layer of a display unit. FIG. 3 shows a schematic view, in cross-section, of another display unit according to an embodiment of the present disclosure. For example, as shown in FIG. 3, at least a portion of at least one of the planarization layer 600, the passivation layer 500, the interlayer dielectric layer 450, the gate insulating layer 430, and the buffer layer 410 may be configured as the magnetic layer 300. In this way, the thickness of the display unit is not increased, so that the display unit may be much lighter or thinner. For example, at least a portion of the planarization layer 600 may be configured as the magnetic layer 300. The distance between the planarization layer 600 and the organic light emitting layer 230 of the organic light emitting diode 200 is small, in this way the magnetic field intensity at the position where the organic light emitting layer 230 is located can be enhanced. The magnetic layer 300 serves as an insulating layer, and a material for producing the magnetic layer may include a magnetic material such as ferrite and the like. In an embodiment, as shown in FIG. 3, as an example, a portion 451 of the interlayer dielectric layer 450 is configured as the magnetic layer 300.

The embodiment of the present disclosure does not limit a size of the magnetic layer 300. For example, in some embodiments of the present disclosure, the magnetic layer 300 is disposed to cover an entire surface of the substrate 100 of the display unit. In other embodiments of the present disclosure, the magnetic layer 300 is patterned without covering the entire surface of the substrate 100 of the display unit so as to avoid a circuit dense region (for example, the region where the thin film transistor 400 is located) of the display unit, thereby reducing the influence of the magnetic field on the electronic elements or circuits of the display unit.

In an embodiment of the present disclosure, as shown in FIG. 3, the magnetic layer 300 may be configured as a patterned magnetic layer, and an orthographic projection of the patterned magnetic layer 300 on the substrate 100 is not overlapped with an orthogonal projection of at least one of the gate electrode 440, the source electrode 470 and the drain electrode 460 of the thin film transistor 400 on the substrate 100. For example, as shown in FIG. 3, the patterned magnetic layer may be further configured such that the orthographic projection thereof on the substrate 100 is not overlapped with an orthographic projection of the entire thin film transistor 400 on the substrate 100. In this way, the influence of the magnetic field of the magnetic layer 300 on the electronic elements or circuits, such as the gate electrode 440, the drain electrode 460 and the source electrode 470 and the like, of the thin film transistor 400 can be reduced.

The embodiment of the present disclosure does not limit the manner of forming the patterned magnetic layer as long as the formed patterned magnetic layer can avoid the circuit dense region in the display unit. In the following, the arrangement of the patterned magnetic layer will be described by taking an example in which at least a portion of the structure layer of the display unit is configured as the magnetic layer 300.

For example, in at least one embodiment of the present disclosure, as shown in FIG. 3, the structural layer, such as the interlayer dielectric layer 450 in a display unit, includes a first portion 451 and a second portion 452, and the second portion 452 corresponds to the thin film transistor 400. The first portion 451 of the interlayer dielectric layer 450 may be configured as the patterned magnetic layer 300, and the second portion 452 of the interlayer dielectric layer 450 is an insulating layer without magnetic properties.

In an embodiment, the interlayer dielectric layer 450 including the first portion 451 and the second portion 452 may be made of an insulating magnetic material such as ferrite. The first portion 451 of the interlayer dielectric layer 450 is magnetized while the second portion 452 of the interlayer dielectric layer 450 is not magnetized so that the first portion 451 of the interlayer dielectric layer 450 has magnetic properties and the second portion 452 of the interlayer dielectric layer 450 does not have magnetic properties. In this way, the first portion 451 configured as the magnetic layer 300 can avoid the region where the thin film transistor 400 is located, thereby reducing the influence of the magnetic field on the thin film transistor 400.

In another embodiment, the interlayer dielectric layer 450 including the first portion 451 and the second portion 452 is made of an insulating material. The first portion 451 of the dielectric 450 is doped with a magnetic material (e.g. magnetized magnetic material particles). In this way, the first portion 451 configured as the magnetic layer 300 can avoid the region where the thin film transistor 400 is located, thereby reducing the influence of the magnetic field on the thin film transistor 400.

The embodiment of the present disclosure does not limit the manner of producing the magnetic layer 300. For example, the method of producing the magnetic layer 300 on the substrate 100 may include an electrodeposition method, a sputtering deposition method, a laser pulse deposition method, a liquid phase epitaxial method, a screen printing method, and the like.

Although in the above-described embodiments, the magnetic layer is disposed between the substrate and the organic light emitting diode, those skilled in the art can understand that in other embodiments, the magnetic layer, the substrate and the organic light emitting diode can also adopt other positional relationships. For example, the organic light emitting diode is located between the magnetic layer and the substrate, or an orthographic projection of the magnetic layer on the substrate is not overlapped with an orthographic projection of the organic light emitting diode on the substrate, as long as the magnetic field of the magnetic layer can affect the organic light-emitting diode.

In an embodiment of the present disclosure, a display panel including the display unit in the above embodiment is provided. For example, the display panel includes a plurality of gate lines, a plurality of data lines, and a plurality of pixel regions defined by the gate lines and the data lines intersecting with each other. A plurality of display units may be arranged in an array in the display panel, and each display unit may correspond to a pixel region. In this way, each pixel region may include at least one magnetic layer 300, and the display effect of display image of each pixel region may be improved.

In the embodiment of the present disclosure, according to actual requirements, the magnetic properties of the magnetic layer 300 in each display unit may be designed to regulate a distribution of a magnetic field in the display panel. For example, in at least one embodiment of the present disclosure, the magnetic layers 300 of any two adjacent display units in the display panel are disconnected from each other, and the luminous efficiency of each organic light emitting diode is mainly affected by the magnetic layer 300 located in the same pixel region. For example, in another embodiment of the present disclosure, the magnetic layers 300 of a plurality of display units in the display panel are disposed in the same layer and interconnected with each other, herein, the term "same layer" refers to the relationship between the layers simultaneously formed in the same step. The term "same layer" does not always mean that the thickness of the layer or the height of the layer in a cross-sectional view is the same. In this way, the magnetic layers 300 of a plurality of display units may be configured as a whole magnetic layer, thereby simplifying the producing process.

The embodiment of the present disclosure does not limit an application field of the display panel. For example, the display panel may be a rigid display panel or a flexible display panel, and may be applied to any product or device having a display function such as a mobile phone, a tablet computer, a television, a monitor, a notebook computer, a digital photo frame, a navigator, and the like.

At least one embodiment of the present disclosure provides a method of producing a display unit, the method include steps of: providing a substrate; forming an electroluminescent unit and at least one magnetic layer on the substrate. The magnetic layer formed in the display unit can increase the proportion of singlet excitons in the organic light emitting diode, and improve the luminous efficiency of the organic light emitting diode, and increase the brightness of the display image of the display unit. The specific structure of the display unit obtained by the producing method can refer to the foregoing embodiments, which is not repeated herein.

FIGS. 4A-4F show schematic views, in cross-section, of a display unit, formed after performing steps, respectively, according to an embodiment of the present disclosure.

Taking a method of producing the structure of the display unit shown in FIG. 3 as an example, as shown in FIG. 4A to FIG. 4F, a method of producing a display unit in an embodiment of the present disclosure may include the following steps.

Figure 4A:
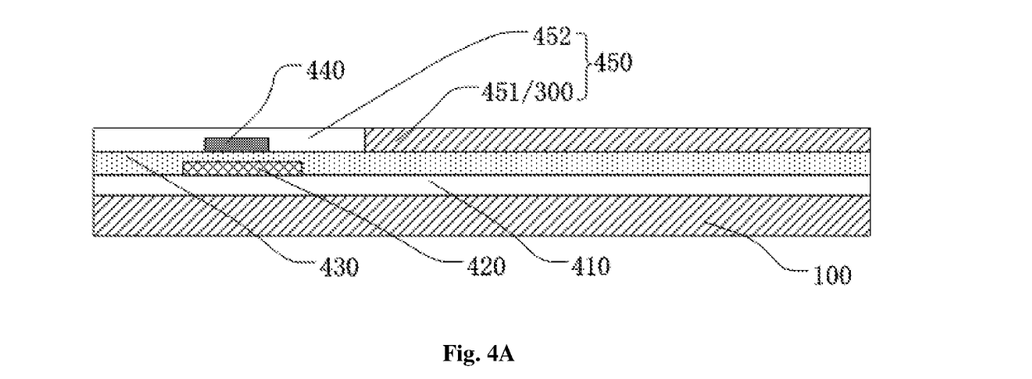
FIGS. 4A-4F show schematic views, in cross-section, of a display unit, formed after performing steps, respectively, according to an embodiment of the present disclosure.

As shown in FIG. 4A, the method may include: providing a substrate 100; and forming a buffer layer 410, an active layer 420, a gate insulating layer 430, a gate layer including a gate electrode 440, and an interlayer dielectric layer 450 sequentially on the substrate 100. The above producing process can refer to a related producing process for a thin film transistor. The related producing process is omitted herein. The substrate 100 may be a flexible substrate or a rigid substrate, and the material for producing the substrate 100 may include glass, metal, or organic polymer (e.g., a polyimide material, a polycarbonate material or a polybutylene terephthalate material), etc.

In an embodiment of the present disclosure, at least a portion of the interlayer dielectric layer 450 may be configured as the magnetic layer 300, and the embodiment of the present disclosure does not limit the method of forming the magnetic layer 300 by using at least a portion of the interlayer dielectric layer 450.

For example, in an embodiment of the present disclosure, as shown in FIG. 4A, the step of forming the interlayer dielectric layer 450 on the substrate 100 may include: depositing an insulating magnetic material on the substrate 100 to form the interlayer dielectric layer 450. At least a portion of the interlayer dielectric layer 450 may serve as the magnetic layer 300. Thus, the magnetic layer 300 can be made to replace at least the portion of the interlayer dielectric layer 450 so as to increase the luminous efficiency of the display unit without increasing the thickness of the display unit. For example, the insulating magnetic material for producing the interlayer dielectric layer 450 may be a ferrite magnetic material or the like.

For example, in another embodiment of the present disclosure, as shown in FIG. 4A, the step of forming the interlayer dielectric layer 450 including a first portion 451 and a second portion 452 on the substrate 100 may include: depositing an insulating magnetic material film on the substrate 100 to form the interlayer dielectric layer 450; and magnetizing the first portion 451 to from the magnetic layer 300. An orthographic projection of the first portion 451 on the substrate 100 does not overlap with an orthographic projection of the thin film transistor 400 to be formed on the substrate 100, but overlaps with an orthographic projection of the organic light emitting diode 200 to be formed on the substrate 100. In this way, the influence of the magnetic field on the circuit dense regions (e.g. the region where the thin film transistor 400 is located shown in FIG. 3) in the display unit can be reduced, and the thickness of the display unit is not increased, so that the display unit may be much lighter or thinner.

The method of forming the magnetic layer 300 at a position of the first portion 451 is not limited to the above steps in the embodiment of the present disclosure. For example, during producing the interlayer dielectric layer 450, an insulating material with magnetic material particles may be deposited at the position of the first portion 451, and an insulating material without magnetic material particles may be deposited at a position of the second portion 452, so that the interlayer dielectric layer 450 is formed on the substrate 100.

Figure 4B:
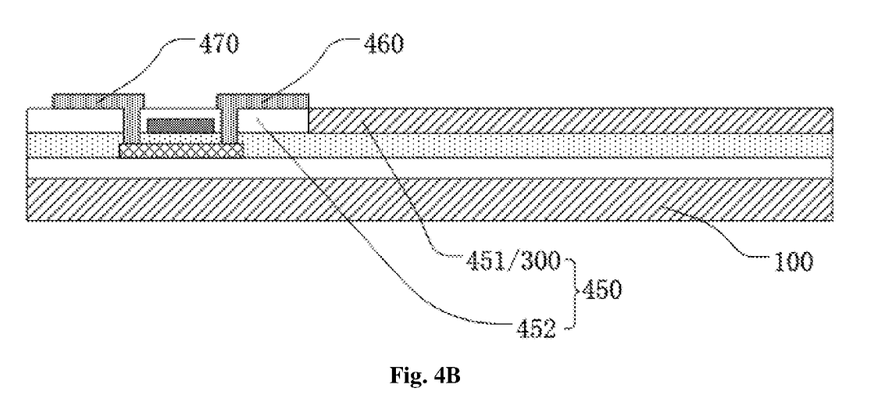

As shown in FIG. 4B, a source/drain layer including a source electrode 470 and a drain electrode 460 is formed on the substrate 100 on which the interlayer dielectric layer 450 has been formed. The method of producing the display unit further includes: forming via holes in the interlayer dielectric layer 450 and the gate insulating layer 430 to expose the active layer 420, and then depositing and patterning a conductive layer film on the substrate 100 to form the source electrode 470 and the drain electrode 460. The source electrode 470 and the drain electrode 460 are respectively electrically connected to the active layer 420 through the via holes.

Figure 4C:
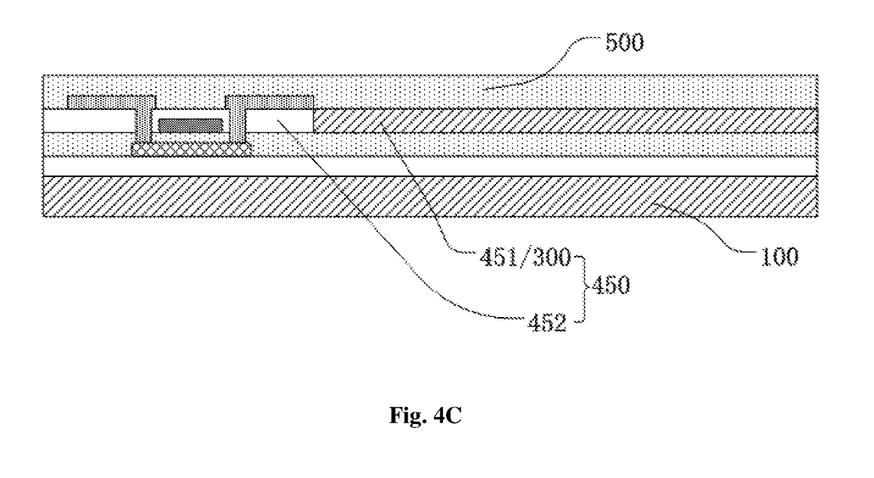

As shown in FIG. 4C, the method of producing the display unit further includes: depositing an insulating layer on the substrate 100 to form a passivation layer 500.

Figure 4D:
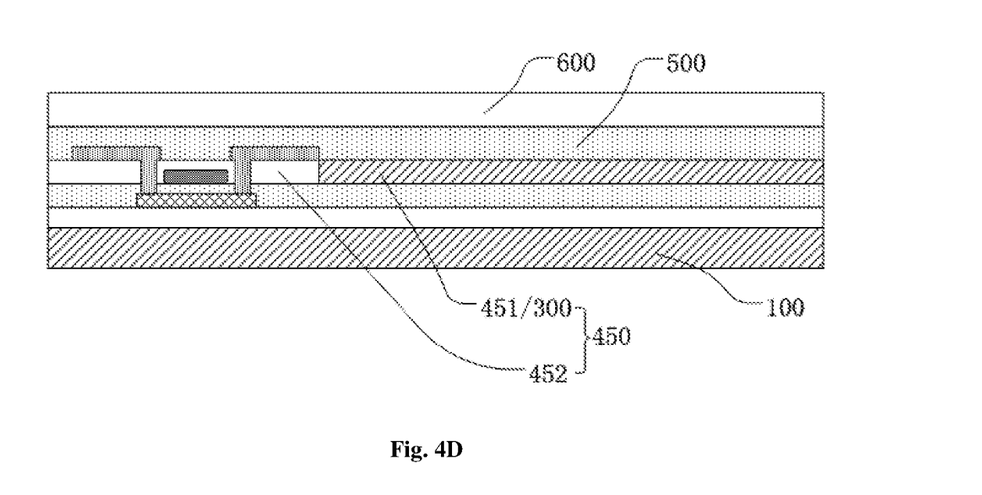

As shown in FIG. 4D, the method of producing the display unit further includes: depositing another insulating layer on the substrate 100 to form a planarization layer 600.

It should be noted that, in the embodiment of the present disclosure, any one or more of the planarization layer 600, the passivation layer 500, the gate insulating layer 430, and the buffer layer 410 may be at least partially configured as the magnetic layer 300, which are not repeated herein.

Figure 4E:
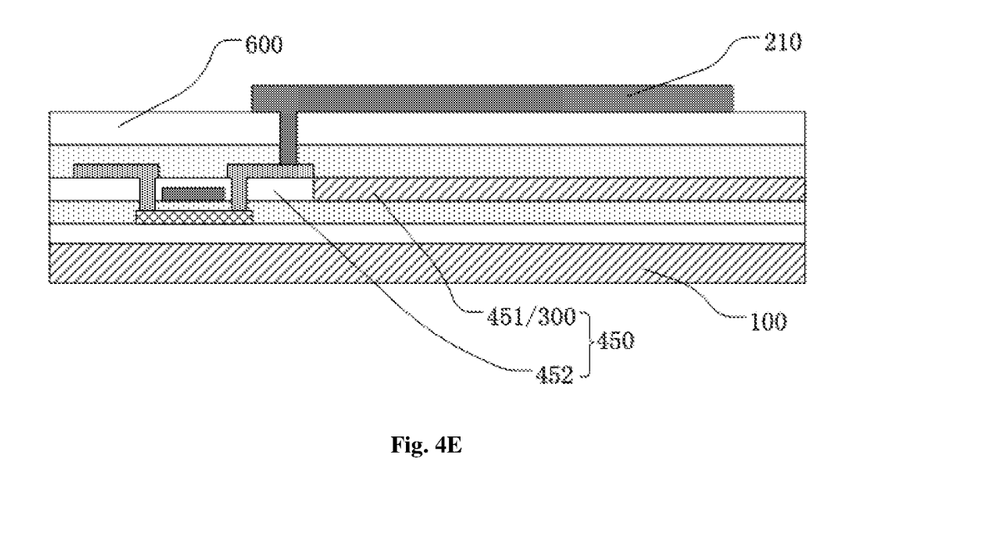

As shown in FIG. 4E, the method of producing the display unit further includes: forming another via hole in the passivation layer 500 and the planarization layer 600, and then depositing and patterning a conductive layer on the planarization layer 600 to form the a first electrode 210. The first electrode 210 is connected to the drain electrode 460 of the thin film transistor through the additional via hole.

Figure 4F:
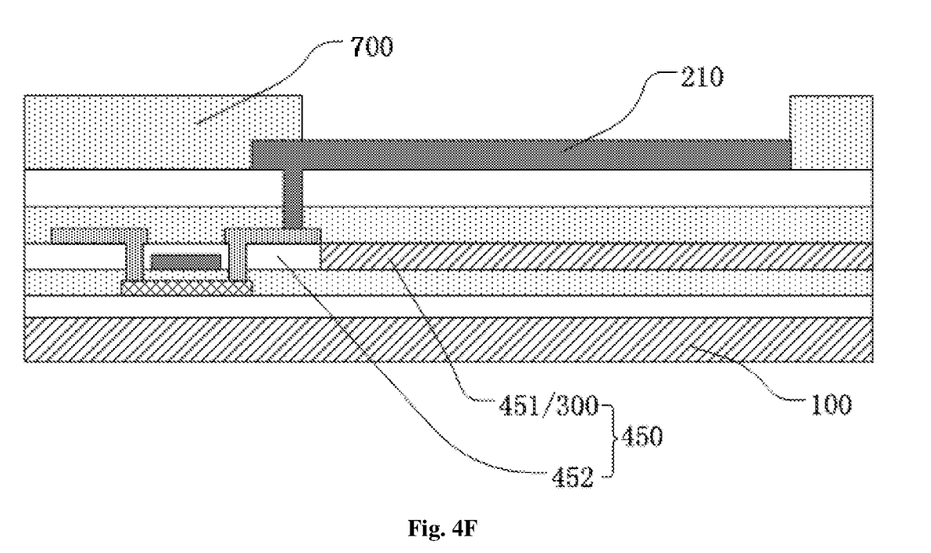

As shown in FIG. 4F, the method of producing the display unit further includes: depositing and patterning another insulating layer on the substrate 100 to form a pixel defining layer 700.

As shown in FIG. 3, the method of producing the display unit further includes: forming an organic light emitting layer 230 in a region defined by the pixel defining layer 700, and then forming a second electrode 220 on a side of the organic light emitting layer 230 away from the substrate 100.

It should be noted that a producing process and a specific structure of the organic light emitting diode 200 are not limited to the description in the above steps. The organic light emitting diode 200 may further include a hole injection layer, a hole transport layer, an electron transport layer, an electron injection layer, etc. In other embodiments, the specific structure of the organic light emitting diode 200 and the producing method thereof are not limited. For example, in an example of implementation of the present disclosure, the method of forming the organic light emitting diode 200 on the substrate 100 may include: depositing the hole injection layer, the hole transport layer, the organic light emitting layer 230, the electron transport layer, the electron injection layer sequentially in a region defined by the pixel defining layer 700, then forming a second electrode 220 on a side of the electron injection layer away from the substrate 100.

As shown in FIG. 3, the method of producing the display unit provided by the embodiment of the present disclosure further includes: forming a packaging layer 800 on the substrate 100 on which the organic light emitting diode 200 has been formed. The packaging layer 800 may be made of a flexible material or a rigid material to be suitable for a flexible packaging or a rigid packaging of the display unit.

In an embodiment of the present disclosure, the magnetic layer 300 may be formed as an individual layer in the display unit. For example, the magnetic layer 300 may be formed between any two adjacent layers of the organic light emitting diode 200, the planarization layer 600, the passivation layer 500, the interlayer dielectric layer 450, the gate insulation layer 430 and the buffer layer 410. In this case, the specific structure of the magnetic layer 300 can refer to the related contents in the foregoing embodiments, and details are not described herein.

For this disclosure, the following points need to be explained:

The drawings of the embodiments of the present disclosure relate only to the structures involved in the embodiments of the present disclosure, and other structures may refer to the relative designs.

For the sake of clarity, in the drawings used to describe embodiments of the present disclosure, the thicknesses of layers or regions are enlarged or reduced, namely, these drawings are not drawn to actual scale.

In the case of no conflict, the embodiments of the present disclosure and the features in the embodiments can be combined with each other to obtain new embodiments.

The above are only specific embodiments of the present disclosure, and the scope of the present disclosure will in no way be limited to the above. The scope of the present disclosure is defined in the claims and their equivalents.

What is claimed is:

1. A display unit, comprising:
   a substrate;
   an electroluminescent unit on the substrate; and
   at least one magnetic layer on the substrate,
   wherein the electroluminescent unit is in a magnetic field of the magnetic layer,
   wherein the electroluminescent unit comprises an electroluminescent layer, and an orthographic projection of the magnetic layer on the substrate is at least partially overlapped with an orthographic projection of the electroluminescent layer on the substrate.

2. The display unit of claim 1, wherein the magnetic layer is between the substrate and the electroluminescent unit.

3. The display unit of claim 2, further comprising:
   at least one of a passivation layer, a planarization layer, a buffer layer, a gate insulating layer and an interlayer dielectric layer between the substrate and the electroluminescent unit,
   wherein the magnetic layer is between the electroluminescent unit and the at least one of the passivation layer, the planarization layer, the buffer layer, the gate insulating layer and the interlayer dielectric layer.

4. The display unit of claim 2, further comprising:
   at least one of a passivation layer, a planarization layer, a buffer layer, a gate insulating layer and an interlayer dielectric layer between the substrate and the electroluminescent unit,
   wherein at least a portion of the at least one of the passivation layer, the planarization layer, the buffer layer, the gate insulating layer and the interlayer dielectric layer is configured as the magnetic layer.

5. The display unit of claim 1, further comprising:
   a switch element disposed on the substrate and connected to the electroluminescent unit,
   wherein an orthographic projection of the magnetic layer on the substrate is not overlapped with an orthographic projection of the switch element on the substrate.

6. The display unit of claim 1, wherein the magnetic layer is made of a permanent magnetic material.

7. The display unit of claim 6, wherein the permanent magnetic material comprises a ferrite magnetic material, a metal alloy magnetic material, or a rare earth magnetic material, or any combination thereof.

8. The display unit of claim 1, wherein the electroluminescent unit comprises an organic light emitting diode device.

9. A display panel, comprising a plurality of display units of claim 1 arranged in an array.

10. The display panel of claim 9, wherein magnetic layers of at least some of the plurality of display units are disposed in a same layer and connected to each other.

11. A method of producing a display unit, comprising steps of:
    providing a substrate; and
    forming an electroluminescent unit and at least one magnetic layer on the substrate, wherein the electroluminescent unit is in a magnetic field of the magnetic layer,
wherein the step of forming the electroluminescent unit on the substrate comprises:
forming an electroluminescent layer,
wherein an orthographic projection of the magnetic layer on the substrate is at least partially overlapped with an orthographic projection of the electroluminescent layer on the substrate.

12. The method of claim 11, wherein the step of forming the magnetic layer is performed before the step of forming the electroluminescent unit, so that the magnetic layer is between the electroluminescent unit and the substrate.

13. The method of claim 12, wherein before the step of forming the electroluminescent unit on the substrate, the method further comprises:
forming at least one of a passivation layer, a planarization layer, a buffer layer, a gate insulating layer and an interlayer dielectric layer,
wherein the magnetic layer is between the electroluminescent unit and the at least one of the passivation layer, the planarization layer, the buffer layer, the gate insulating layer and the interlayer dielectric layer.

14. The method of claim 12, wherein before the step of forming the electroluminescent unit on the substrate, the step of forming the magnetic layer on the substrate comprises:
forming at least one of a passivation layer, a planarization layer, a buffer layer, a gate insulating layer and an interlayer dielectric layer; and
magnetizing at least a portion of the at least one of the passivation layer, the planarization layer, the buffer layer, the gate insulating layer and the dielectric interlayer layer.

15. The method of claim 11, further comprising:
forming a switch element on the substrate, the switch element being connected to the electroluminescent unit,
wherein an orthographic projection of the magnetic layer on the substrate is not overlapped with an orthographic projection of the switch element on the substrate.

* * * * *